United States Patent
Cheng et al.

(10) Patent No.: US 6,558,228 B1
(45) Date of Patent: May 6, 2003

(54) METHOD OF UNLOADING SUBSTRATES IN CHEMICAL-MECHANICAL POLISHING APPARATUS

(75) Inventors: Wen-Kung Cheng, Toufen (TW); Hung-Ju Chien, Hsin-Chu (TW); Jin-Chang Chen, Maioli (TW); Ying-Lang Wang, Tai-Chung County (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/439,363

(22) Filed: Nov. 15, 1999

(51) Int. Cl.$^7$ .............................. B24B 49/00; B24B 1/00
(52) U.S. Cl. ................. 451/7; 451/41; 451/53; 451/56
(58) Field of Search .......................... 451/41, 56, 444, 451/7, 285–290, 53

(56) References Cited

U.S. PATENT DOCUMENTS

| | | | |
|---|---|---|---|
| 5,320,706 A | * 6/1994 | Blackwell | 451/283 |
| 5,624,299 A | 4/1997 | Shendon | 451/28 |
| 5,761,023 A | 6/1998 | Lue et al. | 361/234 |
| 5,851,140 A | 12/1998 | Barns et al. | 451/288 |
| 6,120,348 A | * 9/2000 | Fujita et al. | 451/5 |
| 6,132,294 A | * 10/2000 | Lin | 451/41 |
| 6,139,406 A | * 10/2000 | Kennedy et al. | 451/444 |
| 6,149,508 A | * 11/2000 | Vanell et al. | 451/56 |

* cited by examiner

Primary Examiner—Maurina Rachuba
(74) Attorney, Agent, or Firm—George O. Saile; Stephen B. Ackerman

(57) ABSTRACT

An improved and new process for separating a substrate from a wetted polishing pad in a CMP apparatus has been developed. Following CMP the polishing pad is wetted with a low surface tension liquid and the substrate is moved across the surface of the polishing pad to cause the interface between the substrate and the polishing pad to be wetted with the low surface tension liquid. The force required to cause separation of the substrate from the polishing pad wetted with said low surface tension liquid is reduced by a factor of about 10 to 30% and the breakage of fragile semiconductor wafer substrates during the unloading operation is markedly reduced. Suitable low surface tension liquids are water at a temperature between about 50° C. and 80° C., or solutions of water with long chain surfactants, such as poly-acrylate, poly-vinyl alcohol, butanol, pantanol or isopropol alcohol.

21 Claims, 2 Drawing Sheets

METHOD OF UNLOADING SUBSTRATES IN CHEMICAL-MECHANICAL POLISHING APPARATUS

BACKGROUND OF THE INVENTION (1) Field of the Invention

This invention relates generally to CMP (Chemical Mechanical Polishing) of substrates, and more specifically to CMP (Chemical Mechanical Polishing) of semiconductor wafer substrates as used in the fabrication of integrated circuits.

(2) Description of Related Art

In the fabrication of semiconductor integrated circuits CMP (Chemical Mechanical Polishing) has been developed for providing smooth topographies on surfaces deposited on the semiconductor substrates. Rough topography results when metal conductor lines are formed over a substrate containing device circuitry. The metal conductor lines serve to interconnect discrete devices, and thus form integrated circuits. The metal conductor lines are further insulated from the next interconnection level by thin layers of insulating material and holes formed through the insulating layers provide electrical access between successive conductive interconnection layers. In such wiring processes, it is desirable that the insulating layers have a smooth surface topography, since it is difficult to lithographically image and pattern layers applied to rough surfaces. CMP can, also, be used to remove different layers of material from the surface of a semiconductor substrate. For example, following via hole formation in an insulating material layer, a metallization layer is blanket deposited and then CMP is used to produce planar metal studs embedded in the insulating material layer.

Briefly, the CMP processes involve holding and rotating a thin, flat substrate of the semiconductor material against a wetted polishing surface under controlled chemical, pressure and temperature conditions. A chemical slurry containing a polishing agent, such as alumina or silica, is used as the abrasive material. Additionally, the chemical slurry contains selected chemicals which react with various surfaces of the substrate during processing. The combination of mechanical and chemical removal of material during polishing results in superior planarization of the polished surface.

In CMP apparatuses the substrate being polished is affixed to a planar carrier head. The carrier head and affixed substrate are then pressed against the polishing pad having the polishing slurry thereon. Examples of CMP carrier heads are shown in the following referenced patents. U.S. Pat. No. 5,624,299 entitled "Chemical Mechanical Polishing Apparatus With Improved Carrier And Method Of Use" granted Apr. 29, 1997 to Norman Shendon describes a substrate carrier having a resilient membrane which loads the substrate against the polishing pad. The membrane may be pressurized to dechuck the substrate and allow the substrate to be front loaded or to float on the polishing pad.

U.S. Pat. No. 5,851,140 entitled "Semiconductor Wafer Polishing Apparatus With A Flexible Carrier Plate" granted Dec. 22, 1998 to Chris E. Barns et al. describes a substrate carrier head for holding a semiconductor wafer substrate during polishing and in which the uniformity of polish pressure between the semiconductor wafer substrate and the polishing pad is improved. The carrier head comprises a rigid plate and a flexible, soft membrane between the rigid plate and the substrate. The cavity formed between the flexible, soft membrane and the rigid plate can be connected to a source of pressurized fluid or to a source of vacuum.

U.S. Pat. No. 5,761,023 entitled "Substrate Support With Pressure Zones Having Reduced Contact Area And Temperature Feedback" granted Jun. 2, 1998 to Brian Lue et al. describes an electrostatic chuck for holding a substrate. The electrostatic chuck uses multiple pressure zones within the chuck so that a heat conducting gas, such as helium, flowing within the zones provides variable heat transfer between the chuck and the substrate. The effect is to control the heat transfer between the chuck and the substrate.

State-of-the-art CMP carrier heads as described in U.S. Pat. No. 5,851,140 and U.S. Pat. No. 5,624,299 have flexible membranes interposed between the carrier head and the substrate. The flexible membranes facilitate substrate loading onto the carrier head, retaining the substrate on the carrier head during CMP, and unloading the substrate from the carrier head. However, when applying CMP to thin semiconductor substrates, as used in the fabrication of integrated circuits, breakage of the semiconductor substrates is a significant problem during the unloading operation following CMP. FIGS. 1A and 1B schematically illustrate CMP of the semiconductor substrate, FIG. 1A, and then the process of unloading the semiconductor substrate following CMP, FIG. 1B. Referring to FIG. 1A, carrier head 10 has flexible membrane 11 interposed between carrier head 10 and semiconductor substrate 12. During CMP the pressurized membrane forces the semiconductor substrate 12 into contact with the wetted polishing pad 13. Upon completion of CMP it is necessary to separate semiconductor substrate 12 from the wetted polishing pad 13, as illustrated in FIG. 1B, in order to move the substrate to a machine position where it may be unloaded from the CMP apparatus. Separation of semiconductor substrate 12 from wetted polishing pad 13 is accomplished by creating a partial vacuum behind the flexible membrane 11. The force created by the partial vacuum must be sufficient to hold the weight of the semiconductor substrate 12 and to overcome the surface tension of the interface between the semiconductor substrate 12 and the wetted polishing pad 13. It is precisely at this step of the unloading procedure that significant semiconductor substrate breakage occurs. Thin semiconductor substrates are brittle and are subject to breakage when excessive stress is applied, as may be the case during conventional unloading procedures.

The method of the present invention reduces the force necessary to separate the semiconductor substrate from the wetted polishing pad and thereby reduces the incidence of semiconductor substrate breakage when unloading the substrate from the CMP apparatus. The method of the present invention has low cost and is easily implemented on state-of-the-art CMP apparatuses.

SUMMARY OF THE INVENTION

It is a general object of the present invention to provide an improved method of unloading a substrate from a CMP apparatus, wherein the method reduces the force necessary to separate the substrate from the wetted polishing pad.

A more specific object of the present invention is to provide an improved method of unloading a substrate from a CMP apparatus, wherein the method reduces incidence of substrate breakage during the unloading operation by reducing the force necessary to separate the substrate from the wetted polishing pad.

Another object of the present invention is to provide an improved method of unloading a substrate from a CMP apparatus, wherein the method reduces incidence of substrate breakage during the unloading operation by reducing the force necessary to separate the substrate from the wetted polishing pad, and said method having low cost and having simple implementation on state-of-the-art CMP apparatuses.

In accordance with the present invention, the above and other objectives are realized by using a method of separating a substrate from a wetted polishing pad in a CMP apparatus comprising the steps of: providing a substrate retained in a conventional CMP carrier head, said carrier head having placed said substrate in contact with a wetted polishing pad within the CMP apparatus; performing a CMP operation using a CMP slurry to remove material from the surface of said substrate in contact with the wetted polishing pad; terminating dispensation of the CMP slurry used to remove material from the surface of said substrate; dispensing onto the polishing pad a liquid having a low surface tension; moving said substrate across said polishing pad wetted with said liquid having a low surface tension to cause the interface between said substrate and said polishing pad to be wetted with said liquid having a low surface tension; and then applying a force to cause separation of the substrate from the polishing pad wetted with said low surface tension liquid.

In a second embodiment of the present invention, the above and other objectives are realized by using a CMP method comprising the steps of: providing a polishing pad affixed to a rotatable polishing platen; providing a rotatable substrate carrier head to hold a substrate against said polishing pad; dispensing a CMP polishing slurry onto said rotatable polishing pad; providing a first means to rotate said substrate carrier head; providing a second means to rotate said polishing platen; polishing said substrate to remove material from the surface of said substrate in contact with said polishing pad wetted with said CMP polishing slurry; terminating dispensation of said CMP polishing slurry used to remove material from the surface of said substrate; dispensing onto the polishing pad a liquid having a low surface tension; moving said substrate across said polishing pad wetted with said liquid having a low surface tension to cause the interface between said substrate and said polishing pad to be wetted with said liquid having a low surface tension; and then applying a force to cause separation of the substrate from the polishing pad wetted with said low surface tension liquid.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The new and improved method of unloading a substrate from a CMP apparatus, wherein the method reduces incidence of substrate breakage during the unloading operation by reducing the force necessary to separate the substrate from the wetted polishing pad will now be described in detail.

Figure 1A:
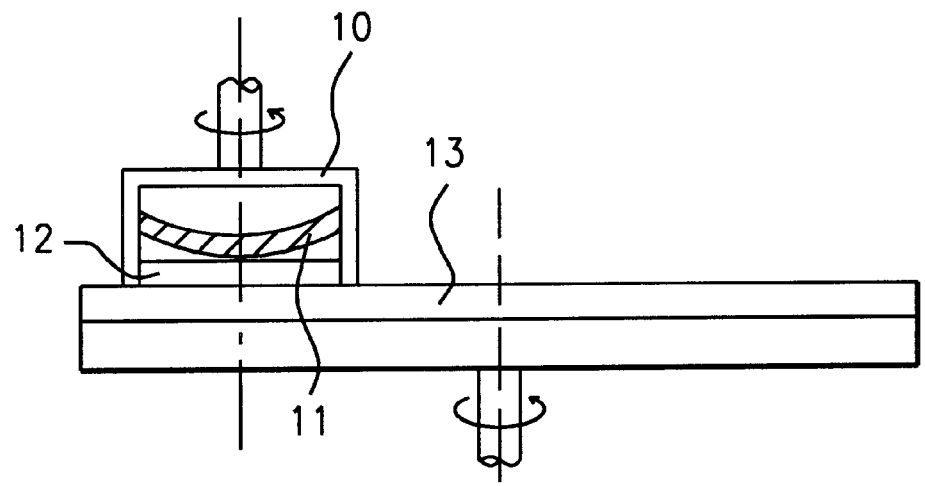
FIG. 1A, which in cross-sectional representation schematically illustrates retention of a substrate in a CMP carrier head during CMP.
Figure 1B:
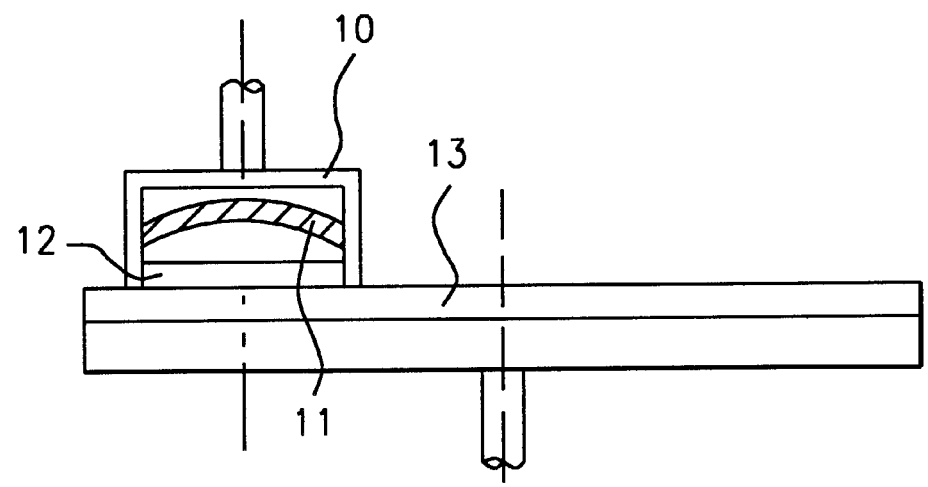
FIG. 1B, which in cross-sectional representation schematically illustrates unloading a substrate from a polishing pad following CMP.
Figure 2:
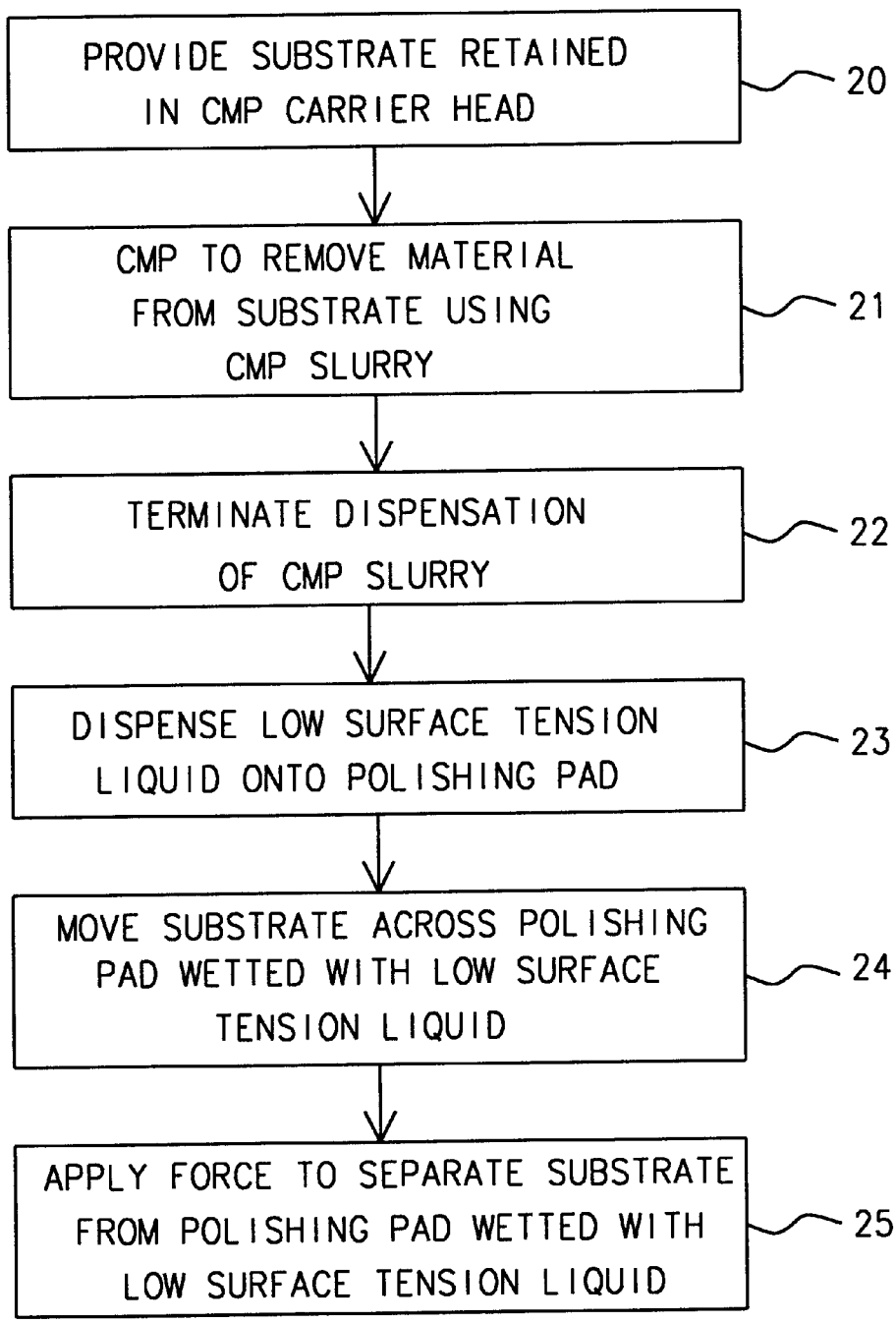
FIG. 2, which is a flow chart of the method of the present invention.

Referring to FIG. 2, which is a flow chart of the method of the present invention, Step 20 provides a substrate retained in a conventional CMP carrier head. In Step 21 CMP, using a CMP slurry, is used to remove material from the substrate by placing the substrate in contact with the polishing pad wetted with the polishing slurry and rotating the polishing pad and/or the substrate to cause abrasion between the substrate and the polishing pad. A suitable slurry for polishing oxide comprises silica or alumina and KOH in $H_2O$ at a pH between about pH=10 and pH=12. A suitable slurry for polishing tungsten comprises silica or alumina and $H_2O_2$ in $H_2O$ at a pH between about pH=2 and pH=4. In Step 22 dispensation of the CMP slurry used to remove material from the surface of the substrate is terminated. An optional step of rinsing the polishing pad with water may be introduced to cleanse the polishing pad of polishing slurry. Next, Step 23, a liquid having a low surface tension is dispensed onto the polishing pad. Then, Step 24, the substrate is moved across the polishing pad wetted with the liquid having a low surface tension to cause the interface between the substrate and the polishing pad to be wetted with the liquid having a low surface tension. Suitable low surface tension liquids are: 1. Water at a temperature between about 50° C. and 80° C.; 2. Water solutions containing surfactants to reduce the surface tension of the solution, where the surfactant is selected from a polyacrylate, such as polyacrylamide, where the Mol fraction of polyacrylamide in water is between about $10^{-4}$ and $10^{-3}$ or alternately the surfactant is isopropol alcohol, butanol or pantanol where the Mol fraction of isopropol alcohol, butanol or pantanol in water is between about $10^{-3}$ and $10^{-2}$. Or yet another alternative surfactant is poly-vinyl alcohol, where the Mol fraction of poly-vinyl alcohol in water is between about $10^{-4}$ and $10^{-3}$. Typically long chain conventional surfactants are suitable for reducing the surface tension of water solutions. Finally, in Step 25, a force is applied to cause separation of the substrate from the polishing pad wetted with said low surface tension liquid. A 10 to 30% reduction in force necessary to separate the substrate from the wetted polishing pad is achieved when the polishing pad is wetted with a low surface tension liquid. This reduction in force necessary to unload the substrate from the polishing pad results in significantly less breakage of fragile substrates, such as thin silicon wafers, during the unloading operation.

While the invention has been particularly shown and described with reference to the preferred embodiments thereof, it will be understood by those skilled in the art that various changes in form and details may be made without departing from the spirit and scope of the invention.

What is claimed is:

1. A method of separating a substrate from a wetted polishing pad in a CMP apparatus comprising the steps of:
   providing a substrate retained in a CMP carrier head, said CMP carrier head having placed said substrate in contact with a wetted polishing pad within the CMP apparatus;
   performing a CMP operation using a CMP slurry to remove material from the surface of said substrate in contact with the wetted polishing pad;
   terminating dispensation of the CMP slurry used to remove material from the surface of said substrate;
   dispensing onto the polishing pad a low surface tension liquid, comprising water at a temperature between about 50° C. and 80° C.;
   moving said substrate across said polishing pad wetted with said low surface tension liquid, comprising water at a temperature between about 50° C. and 80° C., to cause the interface between said substrate and said polishing pad to be wetted with said low surface tension liquid, comprising water at a temperature between about 50° C. and 80° C.; and then applying a force to cause separation of the substrate from the polishing pad wetted with said low surface tension liquid, comprising water at a temperature between about 50° C. and 80° C.

2. The method of claim 1, wherein said substrate is a semiconductor wafer.

3. The method of claim 2, wherein said semiconductor wafer comprises silicon.

4. The method of claim 1, wherein said liquid having a low surface tension is a water solution containing a surfactant to reduce the surface tension of the solution.

5. The method of claim 4, wherein said surfactant comprises a poly-acrylate, such as polyacrylamide, where the Mol fraction of polyacrylamide in water is between about $10^{-4}$ and $10^{-3}$.

6. The method of claim 4, wherein said surfactant comprises poly-vinyl alcohol, where the Mol fraction of poly-vinyl alcohol in water is between about $10^{-4}$ and $10^{-3}$.

7. The method of claim 4, wherein said surfactant comprises isopropol alcohol, where the Mol fraction of isopropol alcohol in water is between about $10^{-3}$ and $10^{-2}$.

8. The method of claim 4, wherein said surfactant comprises butanol, where the Mol fraction of butanol in water is between about $10^{-3}$ and $10^{-2}$.

9. The method of claim 4, wherein said surfactant comprises pantanol, where the Mol fraction of pantanol in water is between about $10^{-3}$ and $10^{-2}$.

10. A CMP method comprising the steps of:

providing a polishing pad affixed to a rotatable polishing platen;

providing a rotatable substrate carrier head to hold a substrate against said polishing pad;

dispensing a CMP polishing slurry onto said rotatable polishing pad;

providing a first means to rotate said substrate carrier head;

providing a second means to rotate said polishing platen;

polishing said substrate to remove material from the surface of said substrate in contact with said polishing pad wetted with said CMP polishing slurry;

terminating dispensation of said CMP polishing slurry used to remove material from the surface of said substrate;

dispensing onto the polishing pad a low surface tension liquid, comprising water at a temperature between about 50° C. and 80° C.;

moving said substrate across said polishing pad wetted with said low surface tension liquid, comprising water at a temperature between about 50° C. and 80° C., to cause the interface between said substrate and said polishing pad to be wetted with said low surface tension liquid, comprising water at a temperature between about 50° C. and 80° C.; and then applying a force to cause separation of the substrate from the polishing pad wetted with said low surface tension liquid, comprising water at a temperature between about 50° C. and 80° C.

11. The method of claim 10, wherein said substrate comprises a semiconductor wafer such as silicon.

12. The method of claim 10, wherein said CMP polishing slurry comprises silica or alumina and polishing chemicals and $H_2O$ at a pH between about pH=10 and pH=12 for polishing oxide.

13. The method of claim 10, wherein said CMP polishing slurry comprises silica or alumina and polishing chemicals and $H_2O$ at a pH between about pH=2 and pH=4 for polishing tungsten.

14. The method of claim 12, wherein said polishing chemical comprises KOH in $H_2O$ at a pH between about pH=10 and pH=12.

15. The method of claim 13, wherein said polishing chemical comprises $H_2O_2$ in $H_2O$ at a pH between about pH=2 and pH=4.

16. The method of claim 10, wherein said liquid having a low surface tension is a water solution containing a surfactant to reduce the surface tension of the solution.

17. The method of claim 16, wherein said surfactant comprises a poly-acrylate, such as polyacrylamide, where the Mol fraction of polyacrylamide in water is between about $10^{-4}$ and $10^{-3}$.

18. The method of claim 16, wherein said surfactant comprises poly-vinyl alcohol, where the Mol fraction of poly-vinyl alcohol in water is between about $10^{-4}$ and $10^{-3}$.

19. The method of claim 16, wherein said surfactant comprises isopropol alcohol, where the Mol fraction of isopropol alcohol in water is between about $10^{-3}$ and $10^{-2}$.

20. The method of claim 16, wherein said surfactant comprises butanol, where the Mol fraction of butanol in water is between about $10^{-3}$ and $10^{-2}$.

21. The method of claim 16, wherein said surfactant comprises pantanol, where the Mol fraction of pantanol in water is between about $10^{-3}$ and $10^{-2}$.

* * * * *